(12) United States Patent
Ohashi

(10) Patent No.: US 6,383,002 B1
(45) Date of Patent: May 7, 2002

(54) HEAT SINK FOR AN ELECTRICAL PART ASSEMBLY

(75) Inventor: Masahito Ohashi, Kawaguchi (JP)

(73) Assignee: Enplas Corporation, Kawaguchi (JP)

( * ) Notice: Subject to any disclaimer, the term of this patent is extended or adjusted under 35 U.S.C. 154(b) by 0 days.

(21) Appl. No.: 09/676,756

(22) Filed: Oct. 2, 2000

(30) Foreign Application Priority Data

Oct. 4, 1999 (JP) .............................................. 11-282327

(51) Int. Cl.⁷ ................................................ H01R 13/15
(52) U.S. Cl. ...................... 439/259; 439/330; 439/342; 439/266; 439/487
(58) Field of Search .................................. 439/259, 261, 439/342, 330, 331, 333, 266, 487

(56) References Cited

U.S. PATENT DOCUMENTS 5,009,608 A * 4/1991 Shipe ........................... 439/331
5,013,256 A * 5/1991 Matsuoka et al. ............ 439/264
5,489,218 A * 2/1996 McHugh ...................... 439/342

* cited by examiner

*Primary Examiner*—Tho D. Ta
*Assistant Examiner*—Truc Nguyen
(74) *Attorney, Agent, or Firm*—Stass & Halsey LLP

(57) ABSTRACT

A socket for an electrical part includes a socket body to which an electrical part having terminals are mounted, a number of contact pins arranged to the socket body so as to be contacted to or separated from the terminals of the electrical part, an operation member mounted to the socket body to be reciprocally movable with respect to the socket body, an open/close unit mounted to the socket body to be opened or closed in accordance with the reciprocal motion of the operation member and to press the electrical part when closed, and a closing speed reduction feature arranged for the open/close unit so as to reduce a closing speed thereof when the open/close unit is rotated in a closing direction thereof.

6 Claims, 12 Drawing Sheets

HEAT SINK FOR AN ELECTRICAL PART ASSEMBLY

BACKGROUND OF THE INVENTION

The present invention relates to a socket for electrical parts for detachably holding electrical parts such as semiconductor device (called "IC package" hereinlater), and more particularly, to a socket for electrical parts provided, to be openable, with an open/close member for holding the electrical part.

Conventionally, there is known, as such "socket for electrical parts", an IC socket for detachably holding an IC package as an "electrical part".

This IC socket has a socket body to which the IC package is mounted and to which contact pins contacting terminals of the IC package are arranged. An operation member is further disposed to be vertically movable with respect to the socket body, and through the vertical movement of the operation member, the contact pins are contacted to or separated from the terminals of the IC package. Simultaneously, an open/close member disposed to the socket body to be rotatable or pivotal is opened or closed, and a heat sink provided for this open/close member is contacted to or separated from an upper surface of the IC package.

However, in the IC socket having such structure as mentioned above, when the open/close member pivotally provided for the socket body is closed, the heat sink abuts against a tip portion of the IC package. Accordingly, as the number of the insertion-withdrawal of the IC package is increased per unit time, the opening or closing speed of the open/close member must be made fast, and at a time when the closing speed is fast, the heat sink of the open/close member will abut against the tip portion of the IC package with a large impact force, thus providing a problem.

SUMMARY OF THE INVENTION

An object of the present invention is to eliminate problems encountered in the prior art mentioned above and to provide a socket for electrical parts capable of reducing an impact to the electrical part by reducing a closing speed of an open/close member disposed to a socket body.

This and other objects can be achieved according to the present invention by providing a socket for an electrical part comprising:

a socket body to which an electrical part having terminals are mounted;

a number of contact pins arranged to the socket body so as to be contacted to or separated from the terminals of the electrical part;

an operation member mounted to the socket body to be reciprocally movable with respect to the socket body;

an open/close unit mounted to the socket body to be opened or closed in accordance with the reciprocal motion of the operation member and to press the electrical part when closed; and a reduction means arranged for the open/close unit so as to reduce a closing speed thereof when the open/close unit is rotated in a closing direction thereof.

In preferred embodiments, the electrical part is an IC package having a tip portion and the open/close unit is provided with a heat sink unit for diffusing a heat of the tip portion of the IC package through the contact thereto.

The closing speed reduction means is composed of a point of force portion formed to the open/close unit to be pressed by the operation member, first and second fulcrums formed thereto as pivotal fulcrums of the open/close unit, and a point of action formed thereof so as to press the electrical part, a distance between the second fulcrum and the point of action is smaller than a distance between the first fulcrum and the point of action, and when the open/close unit is closed form the opened state, the pivotal fulcrum is transferred from the first fulcrum to the second fulcrum to thereby reduce the closing speed of the open/close unit.

The open/close unit includes a pivotal arm having substantially a gate shape, and the first fulcrum is a first pivotal member provided for the socket body, the second fulcrum is a second pivotal member provided for the socket body and the point of force is a force point shaft formed to the pivotal arm.

An urging spring may be further disposed for applying an urging force to a front end portion of the open/close unit in the closing direction thereof.

The open/close unit comprises a pair of open/close members which are opened or closed together in an opposed attitude and the heat sink unit comprises a pair of heat sinks provided for the open/close members, respectively.

The closing speed reduction means may be composed of first and second pivotal projections provided for the pivotal arm as first and pivotal fulcrums and first and second rotation (pivotal motion) support members formed to the socket body, the first rotational projection being fitted to the first rotation support members to be pivotal and the second pivotal projection being fitted to the second rotation support member to be pivotal when the first pivotal fulcrum is transferred to the second pivotal fulcrum in accordance with the closing operation of the open/close unit.

According to the socket for an electrical part of the structures and characters mentioned above, when the open/close unit is rotated in its closing direction, the closing speed can be reduced by the location of the closing speed reduction means, thus reducing an impact force at an abutting time of the open/close unit against the electrical part. Furthermore, since closing speed of the open/close unit can be reduced from the closing intermediate point, the rotating (pivotal) speed of the open/close unit to the closing intermediate point can be set to be relatively fast, so that the total closing time is not so elongated. Thus, in the case of the performance test with the electrical part being mounted to the socket, the insertion-withdrawal number is not so reduced per unit time. Furthermore, this speed reduction means is composed of relatively simple structure, so that the closing speed reduction can be easily performed.

Still furthermore, the tip portion is disposed at the heart portion of the IC package, so that the reduction of impact to this tip portion is significantly effective and advantageous.

Further, since the urging force of the urging means such as spring acts to the front end portion of the open/close unit, the pressing force of the open/close unit to the electrical part is not adversely reduced.

The present invention is effectively applicable as an IC socket for an IC package as electrical part.

The nature and further characteristic features of the present invention will be made more clear from the following descriptions made with reference to the accompanying drawings.

BRIEF DESCRIPTION OF THE DRAWINGS

In the accompanying drawings:

FIG. 5 includes sectional views showing an open/close operation of a contact pin according to the first embodiment, in which

DESCRIPTION OF THE PREFERRED EMBODIMENTS

Figure 1:
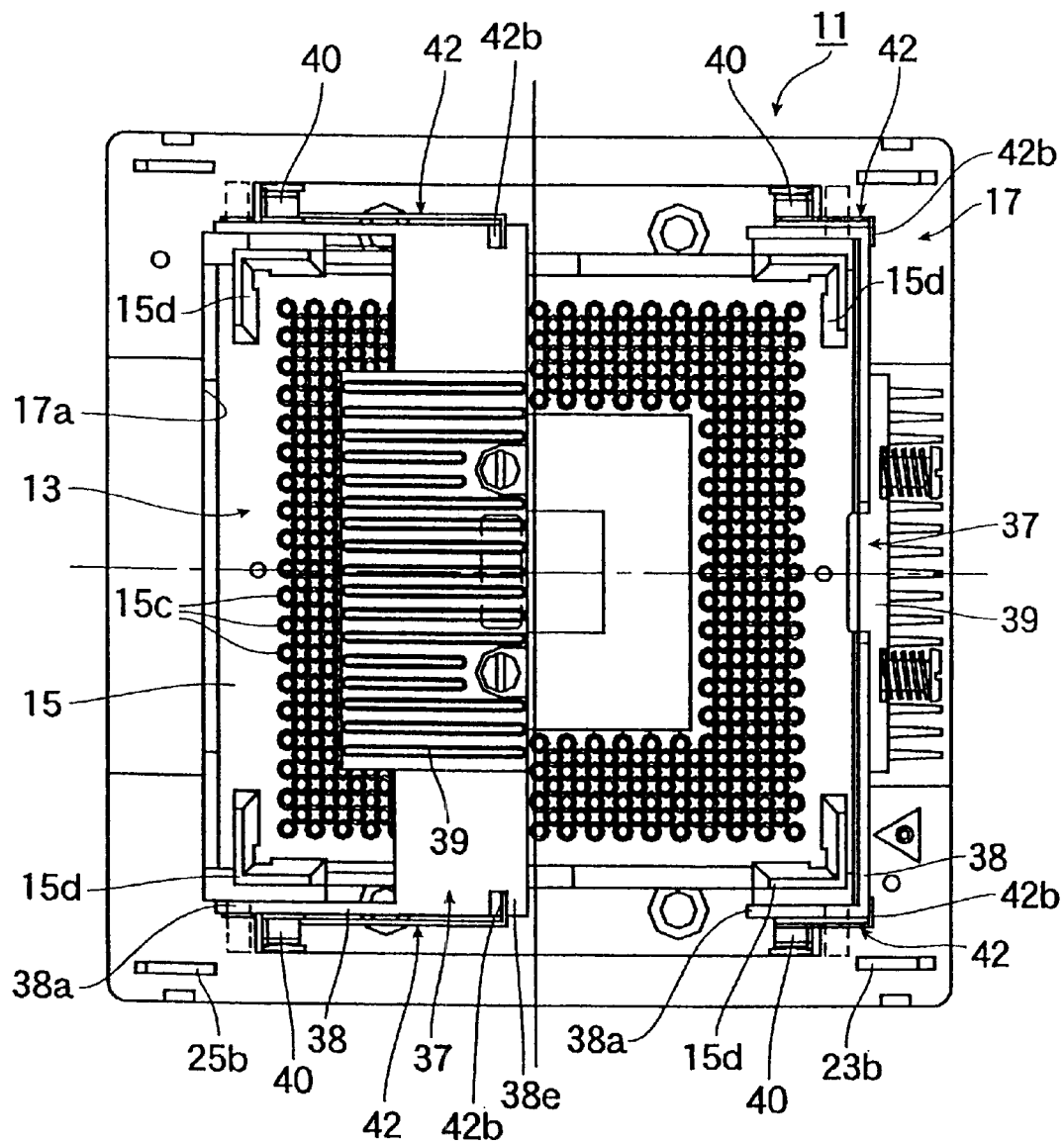
FIG. 1 is a plan view of an IC socket according to a first embodiment of the present invention.
Figure 2:
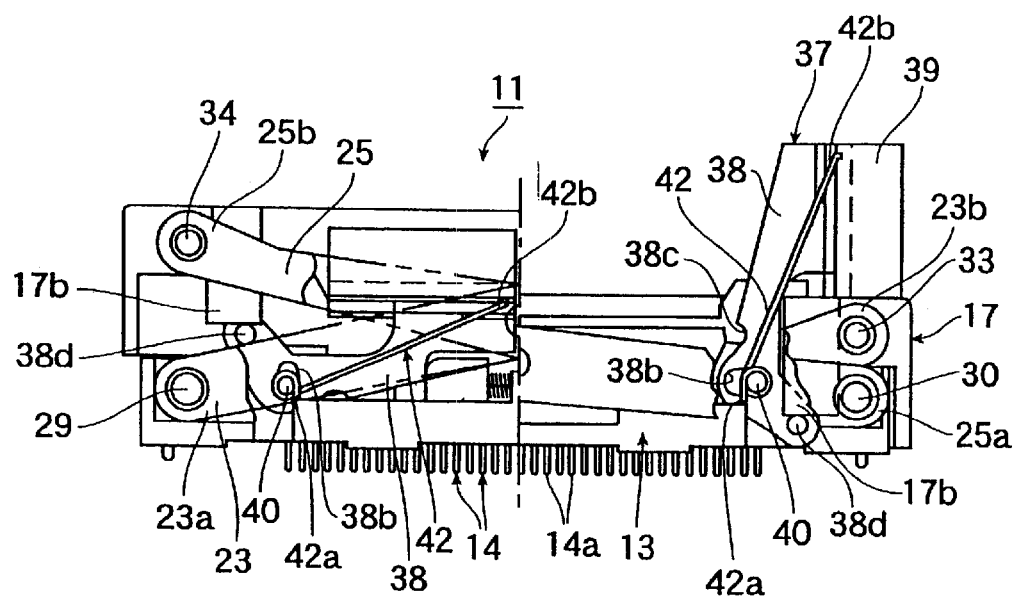
FIG. 2 is a front view, partially broken away, of the IC socket of the first embodiment.
Figure 3:
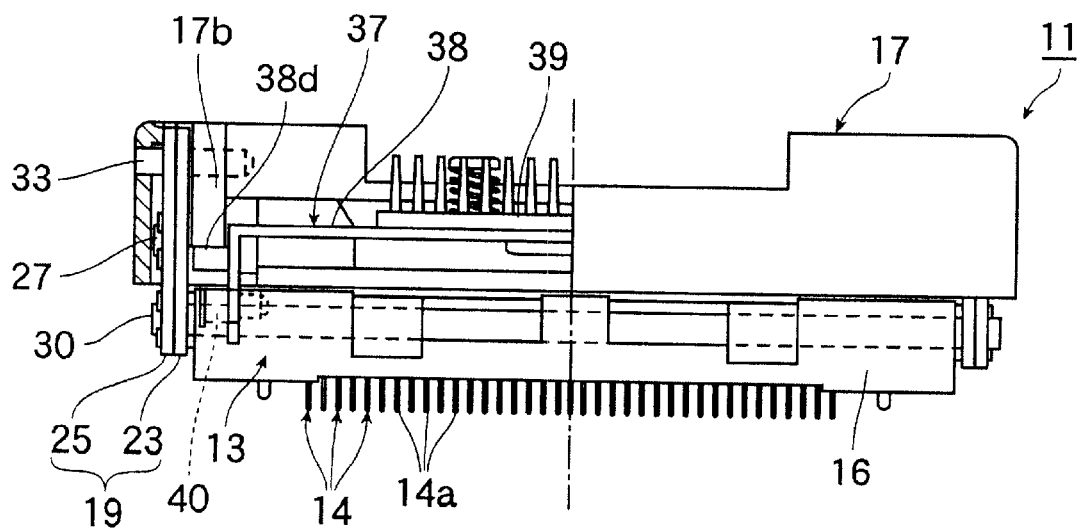
FIG. 3 is a right side view, partially broken away, of the IC package of the first embodiment.

Preferred embodiments of the present invention will be described hereunder with reference to the accompanying drawings.

Further, it is to be noted that the term showing directions or positions such as "upper", "lower", "right", "left" or like used herein are represented in an installed state for use or illustrated state in Figs.

[First Embodiment 1]

The first embodiment will be described hereunder with reference to FIGS. 1 to 10.

Reference numeral 11 denotes an IC socket as "a socket for electrical parts", and the IC socket 11 is a device for achieving an electrical connection between a pin-shaped terminal 12b as a "terminal" of an IC package 12 as "an electrical part" and a printed circuit board, not shown, such as tester for carrying out a performance test of the IC package 12.

The IC package 12 has a package body 12 having a lower surface from which a number of pin-shaped terminals 12b project in a matrix arrangement.

The IC socket 11 has a socket body 13 to be mounted to the printed circuit board. The socket body 13 is provided with a base portion 16 to which a number of contact pins 14 are attached, and a slide plate 15 is slidably disposed above the base portion 16.

Figure 6:
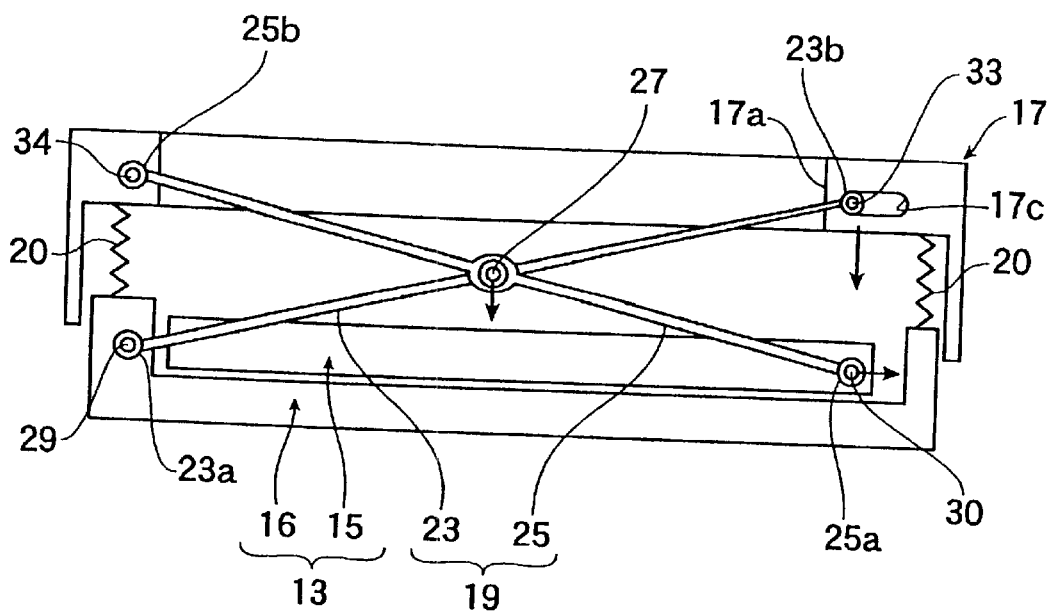
FIG. 6 is an illustration showing an operation of the X-shaped link member according to the first embodiment.

Furthermore, the slide plate 15 is disposed to be transversely movable in the lateral direction as viewed in FIG. 6, and by transversely moving the slide plate 15 by a mechanism mentioned hereinlater, the contact pins 14 arranged to the socket body 13 are elastically deformed.

Figure 4:
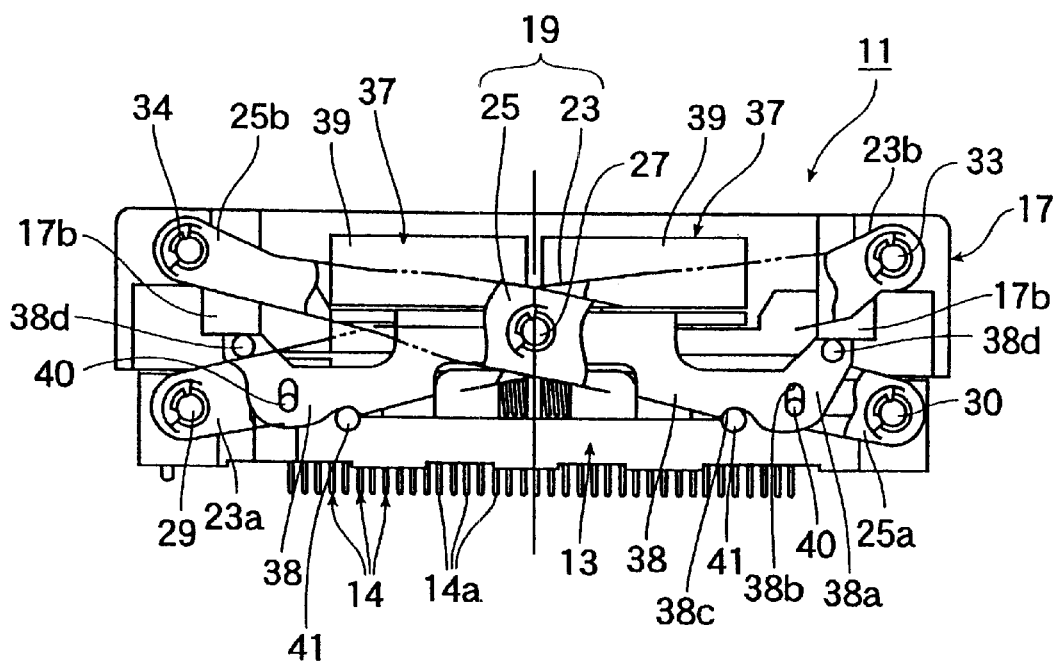
FIG. 4 is a plan view showing an arrangement of an open/close member and an X-shaped link member according to the first embodiment.

Still furthermore, an operation member 17 having a rectangular frame structure is disposed to the socket body 13 to be vertically movable, and when the operation member 17 is vertically moved, the slide plate 15 is transversely moved through an X-shaped link 19 shown in FIG. 4 or 6.

Figure 5A:
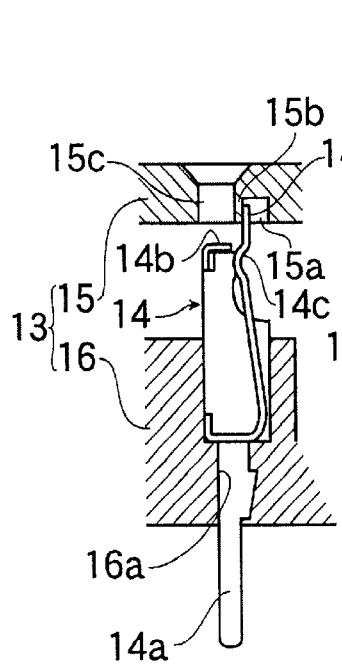
FIG. 5A shows a state that both contact portions of the contact pin are closed.
Figure 5B:
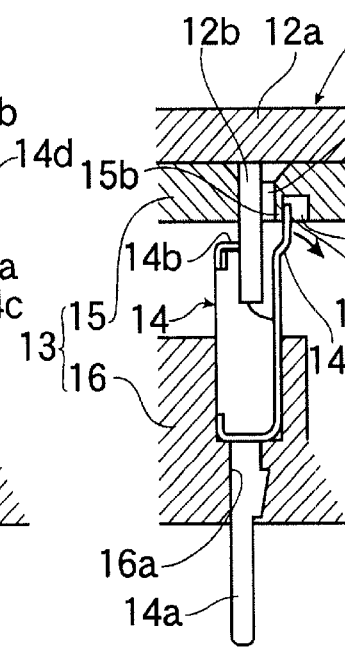
FIG. 5B shows a state that a pin-shaped terminal of the IC package is inserted into both the opened contact portions.
Figure 5C:
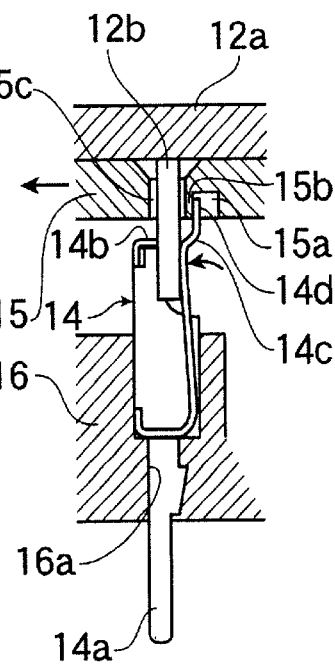
FIG. 5C shows a state that the pin-shaped terminal of the IC package is clamped between both the contact portions.

More in detail, each of the contact pins 14 has a springy or elastic property as shown in FIGS. 5A, 5B and 5C and is formed from a plate member having an excellent conductivity. Such contact pins 14 are fitted into press-fit holes 16a formed to the base portion 16 and then fixed thereto, and lead portions 14a are disposed so as to project downward from the base portion 16 to establish an electrical connection between the lead portions 14a and the printed circuit board. The upper portion of the contact pin 14 is formed with a stationary side contact portion 14b and a movable side contact portion 14c between which the pin-shaped terminal 12b of the IC package 12 is held and clamped.

The movable contact portion 14c has an upper end 14d which is inserted into an insertion hole 14a formed to the slide plate 15 and then engaged with an engaging portion 15b thereof. When the slide plate 15 is slid in this state, the movable contact portion 14c is elastically deformed to thereby expand an interval between both the contact portions 14b and 14c as shown in FIG. 5B.

The slide plate 15 has a rectangular structure on which the IC package 12 is mounted and is formed with insertion holes 15c into which the pin-shaped terminals 12b of the IC package 12, respectively.

Furthermore, the slide plate 15 is formed with, as shown in FIG. 1 and others, guide portions 15d at four portions corresponding to four corner portions of the IC package 12 for positioning the IC package 12 at the mounting time thereof.

Incidentally, as shown in FIG. 1, the operation member 17 has a rectangular frame structure having a large opening 17a allowing the IC package 12 to be inserted. The IC package 12 is inserted through this opening 17a and then mounted on the slide plate 15, and the operation member 17 is disposed to the socket body 13 to be vertically movable. Further, as shown in FIG. 6, the operation member 17 is urged upward by a spring 20 disposed between the operation member 17 and the socket body 13.

Still furthermore, the X-shaped link 19 is disposed to each side surface portion of the slide plate 15 along the transversely moving direction thereof.

More in detail, the X-shaped link 19 is composed of, as shown in FIGS. 4 and 6, first link member 23 and a second link member 25 which have substantially the same length and are coupled at their central portions to be relatively rotatable by means of central coupling pin 27.

The first link member 23 has a lower end portion 23a which is connected to the socket body 13 to be rotatable by means of lower end coupling pin 29, and the second link member 25 also has a lower end portion 25a which is connected to one end portion of the side surface of the slide plate 15 along its transversely moving direction to be rotatable by means of lower end coupling pin 30. Furthermore, the first and second link members 23 and 25 have upper end portions 23b and 25b which are coupled to the operation member 17 to be rotatable by means of upper end coupling pins 33 and 34. The upper end coupling pin 33 disposed to the upper end portion 23b of the first link member 23 is inserted, as shown in FIG. 6, into a slot (long hole) 17c formed to the operation member 17 so as to extend in substantially the horizontal direction thereof with no play to be thereby slidable in the horizontal direction. According to such structure, when the operation member 17 is lowered, i.e. moved downward, the slide plate 15 is slid in an arrowed direction in FIG. 6 through the X-shaped links 19.

Furthermore, a pair of open/close members 37 as a unit are mounted to the base portion 16 of the socket body 13 to be rotatable (i.e. pivotal) to be opened or closed like so-called a French door. The open/close members 37 are provided with heat sinks 39 which abut against tip portions of the IC package 12 at the central portions of pivotal arms 38 each having approximately gate-shape to thereby diffuse heat of the IC package 12. The heat sinks 39 are for example formed through an aluminium die-casting process so as to provide a good electrical conductivity.

Figure 7:
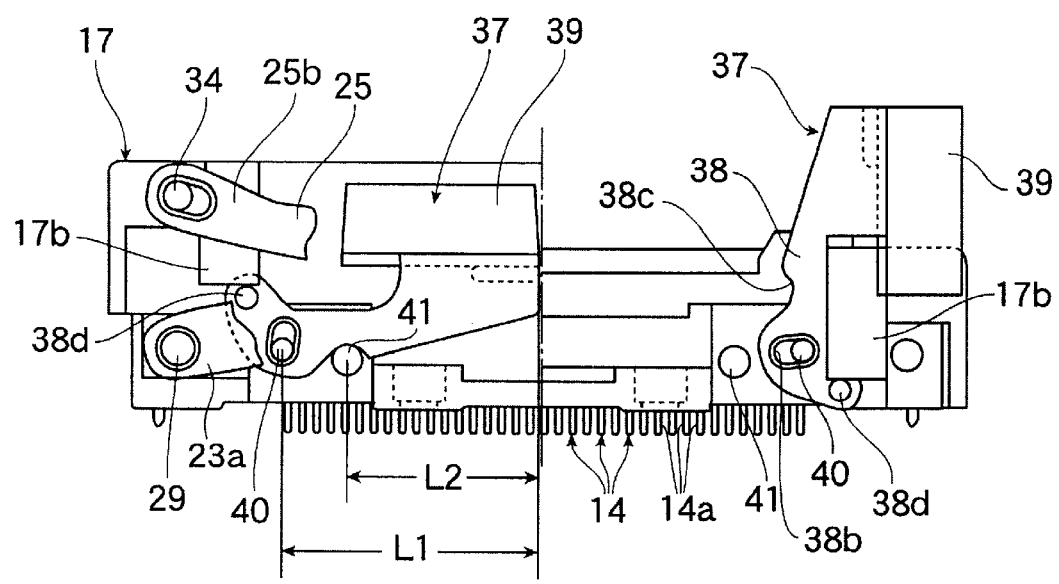
FIG. 7 is an illustration showing an operation of the open/close member according to the first embodiment, in which the left half shows a closed state of the open/close member and the right half shows an opened state thereof.
Figure 8:
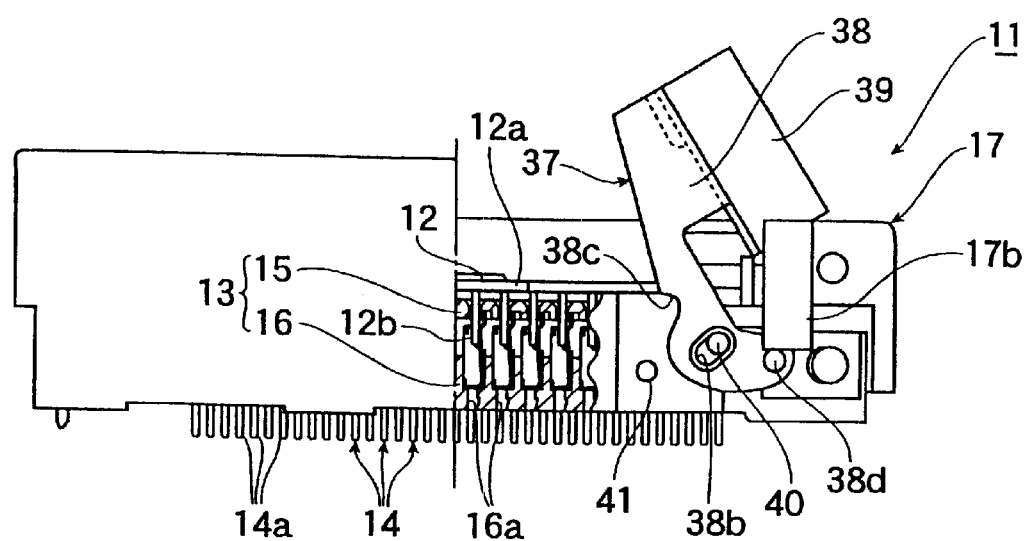
FIG. 8 is a view showing a state of the open/close member on the way of being closed.
Figure 9:
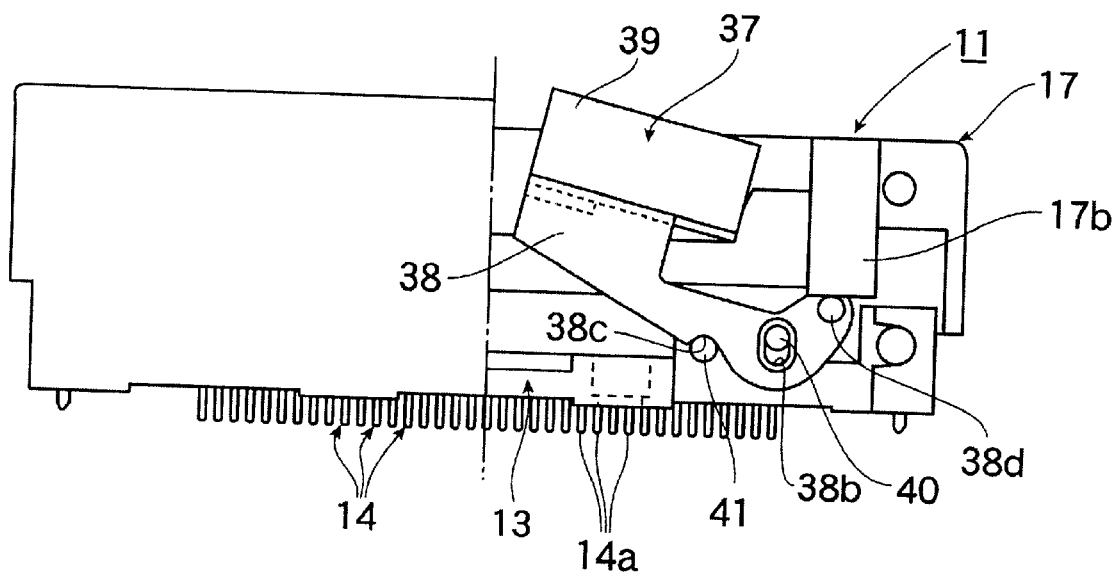
FIG. 9 is a view showing a state of the open/close member on the way of being further closed.

The pivotal arm 38 is, as shown in the left half portion of FIG. 7, formed, on its base end side 38a, with a slot 38b along the vertical direction in the closed state of the open/close member 37, and a first pivot (pivotal shaft pin) 40 as "a first pivotal fulcrum" formed to the base portion of the socket body 13 is inserted into this slot 38b. Furthermore, the pivotal arm 38 is formed with a notch 38c at the lower edge portion near the front end side other than the slot 38, and a second pivot (pivotal shaft pin) 41 as "a second pivotal fulcrum" engaged with the notch 38c is formed to the base portion 16 of the socket body 13. Still furthermore, a force point shaft 38d as "a point of force" is formed to the base end portion 38a of the pivotal arm 38 so as to project therefrom, and the force point shaft 38d is constructed so as to be pressed by a press portion 17b of the operation member 17.

A spring 42 as "an urging means" for urging the open/close member 37 to a direction to be closed is located. This spring 42 is wound up around the outer periphery of the first pivot 40, and the spring 42 has one end 42a engaged with the base portion 16 of the socket body 13 and the other one end 42b engaged with the front end portion 38e of the pivotal arm 38. According to such structure, the urging force of the spring 42 is set so as to be applied to a direction along which the front end portion 38e of the open/close member 37 is closed.

When the open/close members 37 are rotated in the direction to be closed, "a reduction means" (closing speed reduction means) is constituted, the reduction means being provided with the force point shaft 38d as the "point of force" to be pressed by the operation member 17, the first pivot 40 as the "first pivotal fulcrum" as the pivot shaft of the open/close member 37, the second pivot 41 as the "second pivotal fulcrum" and the heat sink 39 as a "point of action" pressing the IC package 12. Further, as shown in FIG. 7, a distance L1 between the first pivot 40 and the heat sink 39 (point of force) is set to be larger than a distance L2 between the second pivot 41 and the heat sink 39.

According to such arrangement, when the open/close members 37 are closed from the fully opened state, the pivotal fulcrum is transferred from the first pivot 40 to the second pivot 41, thereby reducing the closing speed of the open/close members 37.

In the IC socket 11 of the structure mentioned above, the IC package 12 is mounted to the socket body 13 in the following fashion.

The operation member 17 is first depressed downward against the urging force of the spring 20 by, for example, an automatic machine. Then, the force point shafts 38d of the open/close members 37 are pressed by the press portion 17b of the operation member 17 to thereby rotate (pivot) the open/close members 37 about the first pivots 40 against the urging force of the springs 42. In such fully opened state of the open/close members 37, as shown in the right half portion of FIGS. 2 and 7, the open/close members 37 have substantially perpendicular attitude which is the position retired from the IC package insertion area.

Further, according to the lowering motion of the operation member 17, the slide plate 15 is slid rightward from the state shown in FIG. 5A through the operation of the X-shaped links 19, whereby the movable contact portions 14c of the contact pins 14 are pressed by the engaging portion 15b of the slide plate 15 and then elastically deformed to thereby open the paired contact portions 14b and 14c of the contact pins 14.

Thereafter, when the IC package 12 is mounted on the slide plate 15, the pin-shaped terminals 12b of the IC package 12 are inserted respectively between the paired contact portions 14b and 14c now opened as shown in FIG. 5B.

Next, when the pressing force for depressing downward the operation member 17 is released, the operation member 17 is moved upward by the urging force of the spring 20, and the slide plate 15 is slid in the leftward direction from the state shown in FIG. 5B to the state shown in FIG. 5C. Accordingly, the movable contact portions 14c of the contact pins 14 are returned to their original positions by the elasticity thereof and, then, the pin-shaped terminals 12b of the IC package 12 is clamped between the paired contact portions 14b and 14c.

At the same time as mentioned above, when the operation member 17 moves upward, the open/close members 37 are rotated about the first pivots 40, so as to be closed, by the urging force of the springs 42. Then, at the time when the open/close members 37 are rotated to the positions shown in FIG. 9, the second pivots 41 are inserted into the notches 38c formed to the pivotal arms 38 and then engaged therewith. At this time, the first pivot 40 is positioned on the upper portion side in the slot 38b of the pivotal arm 38.

Figure 10:
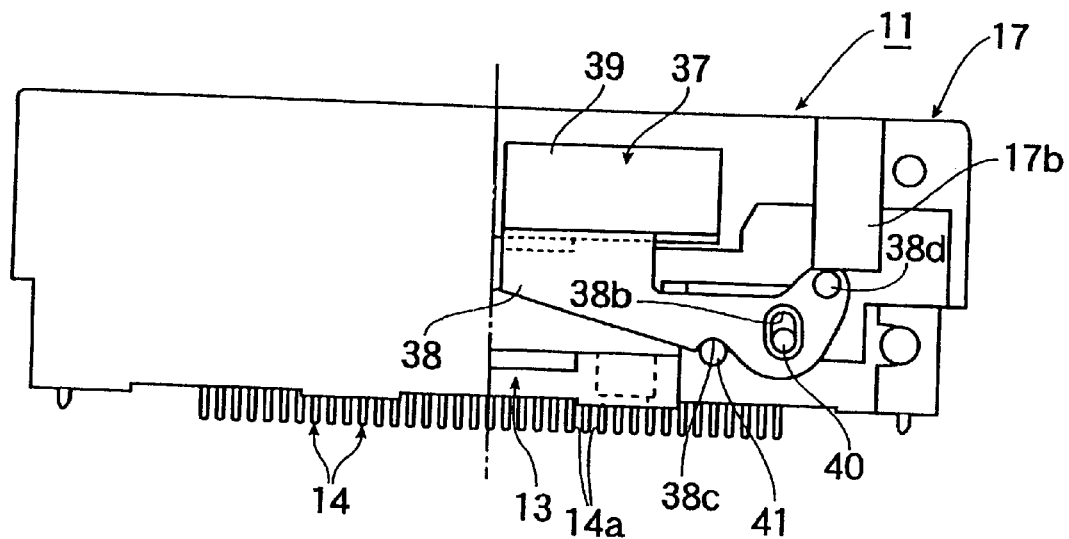
FIG. 10 is a view showing a state of the open/close member being completely closed.

When the open/close members 37 are further rotated in the closing direction from the above mentioned state, the pivotal fulcrum is transferred to the second pivot 41 about which the open/close members 37 are then rotated. Thus, through this operation, as shown in FIG. 10, the open/close members 37 are closed and the heat sinks 39 abut against the tip portion of the IC package 12.

During the operations mentioned above, the open/close members 37 are first rotated about the first pivot 40 from the closing starting time to the closing intermediate time, and then, rotated about the second pivot 41 from this closing intermediate time to the time of abutting against the tip portion of the IC package 12. In this operation, since the distance L1 between the first pivot 40 and the heat sink 39 (point of force) is set to be larger than the distance L2 between the second pivot 41 and the heat sink 39, the rotating (pivotal) speed (closing speed) is made slow.

Accordingly, as the open/close members 37 are being closed, the closing speed thereof is reduced from the time when the pivot fulcrum is transferred to the second pivot 41, and hence, the colliding impact of the heat sinks 39 against a die of the IC package 12 can be significantly reduced. Furthermore, it is possible to set the pivotal speed of the open/close members 37 to be relatively fast till the time when the pivotal fulcrum is transferred to the second pivot 41, so that it is not necessary to reduce so much the insertion-withdrawal numbers per unit time of the IC package 12, thus being advantageous.

Still furthermore, since the the other one end portion 42b of the spring 42 is engaged with the front end portion 38e of the pivotal arm 38 and the urging force of the spring 42 acts to the front end portion 38e as a force directing downward, when the pivotal fulcrum is transferred from the first pivot 40 to the second pivot 41 as mentioned above, the depressing force applied to the open/close member 37 by the spring 42, that is, depressing force applied to the. IC package 12 by the heat sink 39, is never reduced.

[Second Embodiment 2]

Figure 11:
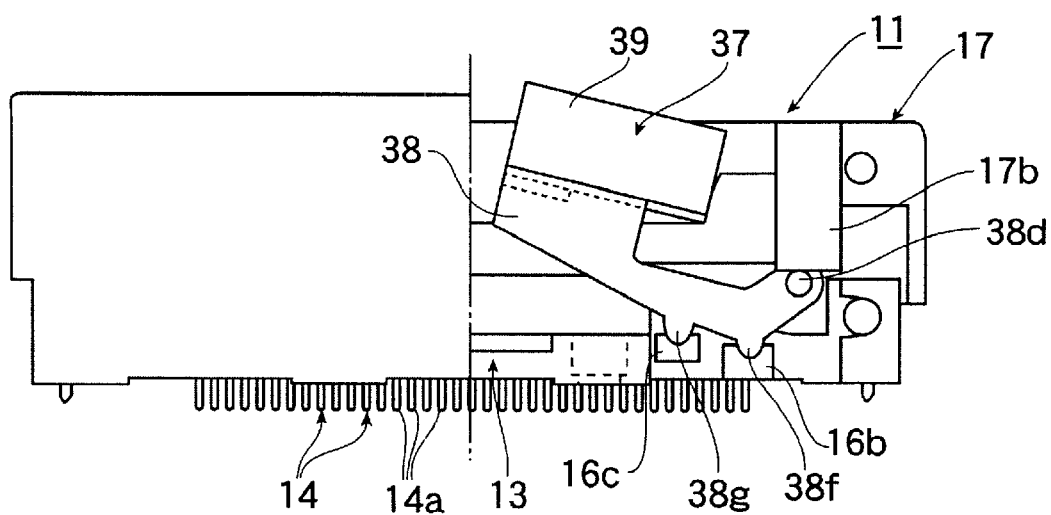
FIG. 11 is a view concerning a second embodiment of the present invention and corresponding to FIG. 9.
Figure 12:
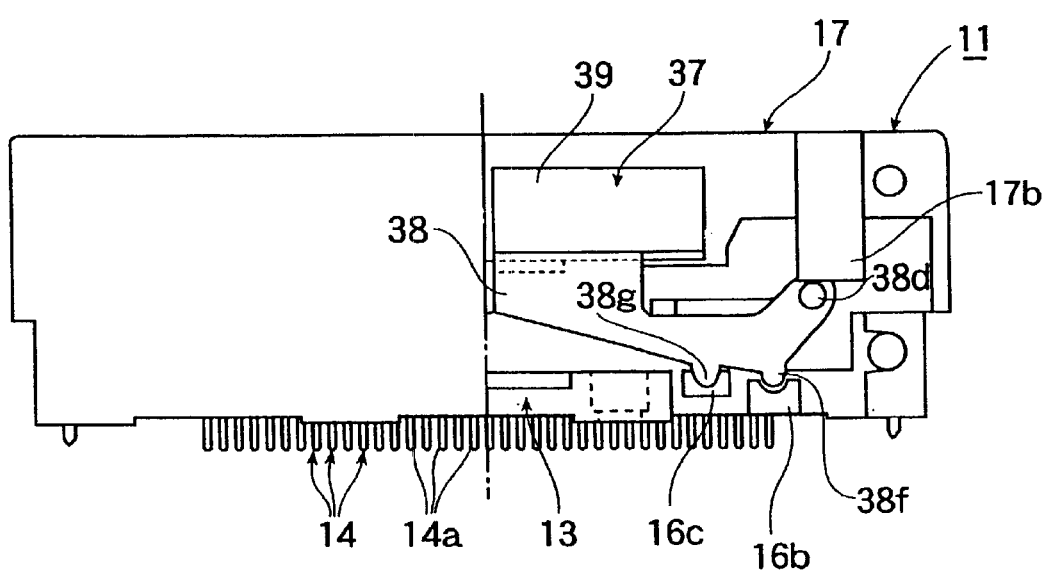
FIG. 12 is a view, concerning the second embodiment, showing a state of the open/close member being completely closed, corresponding to the state of FIG. 10.

FIGS. 11 and 12 represent a second embodiment of the present invention.

With reference to FIGS. 11 and 12, the second embodiment has a structure that the pivotal arm 38 of the open/close member 37 has a first pivotal projection 38f as the "first pivotal fulcrum" and a second pivotal projection 38g as the "second pivotal fulcrum". The first pivotal projection 38f is rotatably fitted to the first rotation (pivotal motion) support 16b formed to the base portion 16 and the second pivotal projection 38g is also rotatably fitted to the second rotation support 16c formed to the base portion 16.

In this second embodiment, when the open/close members 37 are closed from the fully opened state, the first pivotal projection is fitted to the first rotation support 16b and then rotated to the closing intermediate time, and in the state shown in FIG. 11, the second pivotal projection 38g is also fitted to the second rotation support 16c. As the open/close members 38 are being further closed, the pivotal fulcrum is transferred to the second pivotal projection 38g, about which the open/close members 37 are rotated, i.e. pivotal.

According to the structure of the second embodiment mentioned above, through the transferring of the pivotal fulcrum from the first pivotal projection 38f to the second pivotal projection 38g, the closing speed of the open/close members 37 can be reduced.

It is of course to be noted that the protruded pivotal projections 38f and 38g may be substituted with recessed ones and, on the other hand, the recessed rotation supports 16b and 16c may be substituted with protruded ones.

Further, it is also to be noted that, in the described embodiments, although the present invention is applied to the IC socket 11 as the "socket for electrical parts", the present invention is not limited thereto and is applicable to other devices. Furthermore, in the above embodiment, although a pair of open/close members 37 are arranged as a unit, a single open/close member may be substituted therefor. The contact pin may have various shapes without being limited to the described one, and for example, a contact pin having one contact portion or having a structure capable of abutting against the terminal from the lower side thereof may be also utilized.

What is claimed is:

1. A socket for an electrical part, comprising:

a socket body to which an electrical part having terminals are mounted;

a plurality of contact pins arranged in the socket body that are contacted to or separated from the terminals of the electrical part;

an operation member mounted in the socket body that is reciprocally movable with respect to the socket body;

an open/close unit mounted in the socket body that is opened or closed in accordance with the reciprocal motion of the operation member and to press the electrical part when closed; and a reduction means arranged in the open/close unit that reduces a closing speed when the open/close unit is rotated in a closing direction, composed of a point of force formed in the open/close unit that is pressed by the operation member, first and second fulcrums that are pivotal fulcrums of the open/close unit, and a point of action that presses the electrical part, wherein a distance between the second fulcrum and the point of action is less than a distance between the first fulcrum and the point of action, and when the open/close unit is closed from the opened state, the rotation fulcrum is transferred from the first fulcrum to the second fulcrum to thereby reduce the closing speed of the open/close unit.

2. A socket for an electrical part according to claim 1, wherein said electrical part is an IC package having a tip portion and said open/close unit is provided with a heat sink that diffuses heat generated at the tip portion of the IC package through contact.

3. A socket for an electrical part according to claim 1, wherein said open/close unit includes a pivotal arm having substantially a gate shape and wherein said first fulcrum is a first pivotal member provided for the socket body, said second fulcrum is a second pivotal member provided for the socket body and said point of force is a force point shaft formed to the pivotal arm.

4. A socket for an electrical part according to claim 1, further comprising an urging means for applying an urging force to a front end portion of the open/close unit in the closing direction thereof.

5. A socket for an electrical part according to claim 1, wherein said open/close unit further comprises:

a pair of open/close members which are opened or closed together in an opposed attitude; and a pair of heat sinks is provided for the open/close members, respectively.

6. A socket for an electrical part, comprising:

a plurality of contact pins arranged in the socket body that are contacted to or separated from the terminals of the electrical part;

an operation member mounted in the socket body that is reciprocally movable with respect to the socket body;

an open/close unit mounted in the socket body that is opened or closed in accordance with the reciprocal motion of the operation member and to press the electrical part when closed; and a reduction means arranged in the open/close unit that reduces a closing speed when the open/close unit is rotated in a closing direction, wherein said open/close unit includes a pivotal arm that is substantially gate shaped and the reduction means is composed of first and second pivotal projections provided for the pivotal arm as first and second pivotal fulcrums and first and second rotation support members are formed to the socket body, the first pivotal projection being pivotally fitted to the first rotation support members and said second pivotal projection being pivotally fitted to said second rotation support members so that the first pivotal fulcrum is transferred to the second pivotal fulcrum in accordance with the closing operation of the open/close unit.

* * * * *